(12) United States Patent
Khuri-Yakub et al.

(10) Patent No.: US 6,295,247 B1
(45) Date of Patent: Sep. 25, 2001

(54) MICROMACHINED RAYLEIGH, LAMB, AND BULK WAVE CAPACITIVE ULTRASONIC TRANSDUCERS

(75) Inventors: B. T. Khuri-Yakub, Palo Alto; F. Levent Degertekin, Millbrae, both of CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 09/411,784

(22) Filed: Oct. 1, 1999

Related U.S. Application Data
(60) Provisional application No. 60/102,762, filed on Oct. 2, 1998.

(51) Int. Cl.[7] .................................................. H04R 17/00
(52) U.S. Cl. ............................................................... 367/140
(58) Field of Search .................................. 367/140, 157, 367/180; 310/326, 334, 337, 309; 29/25.35, 594

(56) References Cited

U.S. PATENT DOCUMENTS

| | | | |
|---|---|---|---|
| 5,287,331 | 2/1994 | Schindel et al. | 367/140 |
| 5,619,476 | 4/1997 | Haller et al. | 367/181 |
| 5,870,351 | 2/1999 | Ladabaum et al. | 367/163 |
| 5,894,452 | 4/1999 | Ladabaum et al. | 367/163 |

Primary Examiner—Daniel T. Pihulic
(74) Attorney, Agent, or Firm—Lumen Intellectual Property Services, Inc.

(57) ABSTRACT

A micromachined capacitive ultrasonic transducer is used to generate and detect Rayleigh, Lamb, and bulk waves in a solid substrate. The transducer contains a substrate with a conductive back electrode, a support material on the substrate, a membrane supported above the substrate by the support material, and a conductive film on the membrane. The support material contains parallel edges defining elongated gaps over which the membrane is supported. Unsupported free regions of the membrane above the gaps are vibrated by applying an electrical signal between the conductive film and conductive back electrode, and stresses are coupled into the substrate at the attachment edges of the membrane. Acoustic modes of the substrate are excited by the stresses, and ultrasonic waves propagate in a direction perpendicular to the parallel edges. By properly choosing the membrane width, material, and thickness, the gap separation distance, and the support material height and thickness, a particular acoustic mode can be selected for a required operating frequency. The gaps may be separated by a distance equal to the wavelength or half-wavelength of the desired acoustic mode. Alternately, the gaps may be grouped, with each group separated by a wavelength or half-wavelength. The transducer can be used in many applications, including filtering and chemical sensing.

18 Claims, 6 Drawing Sheets

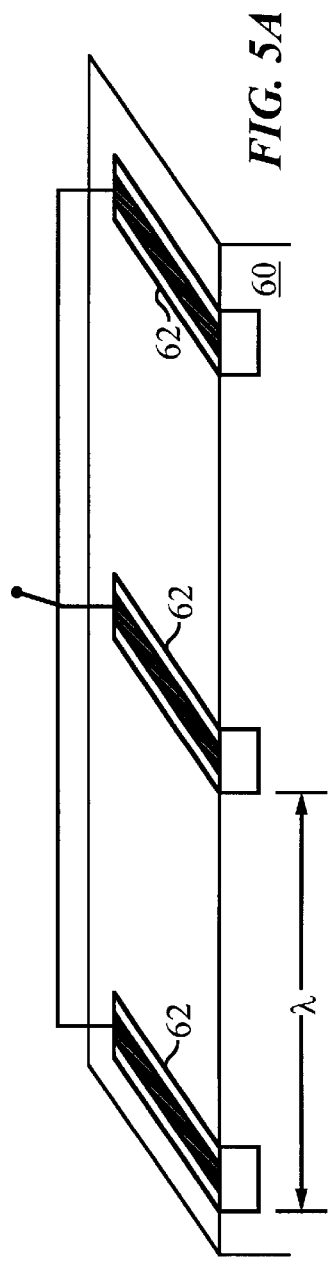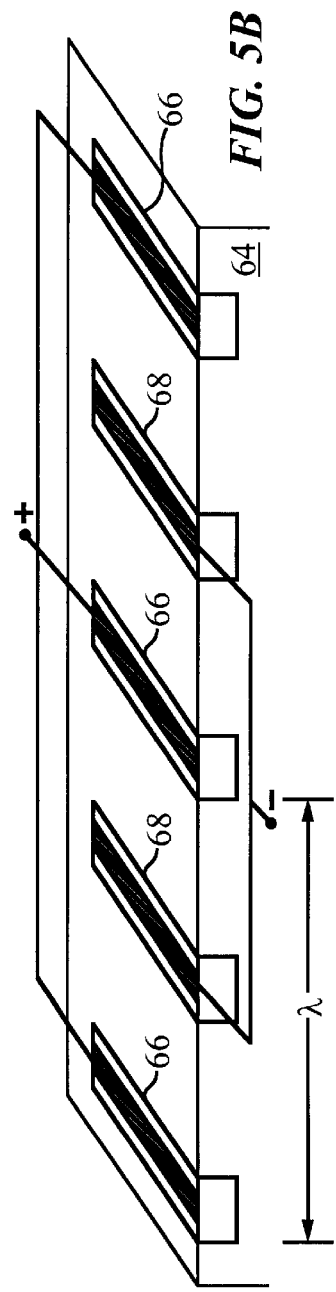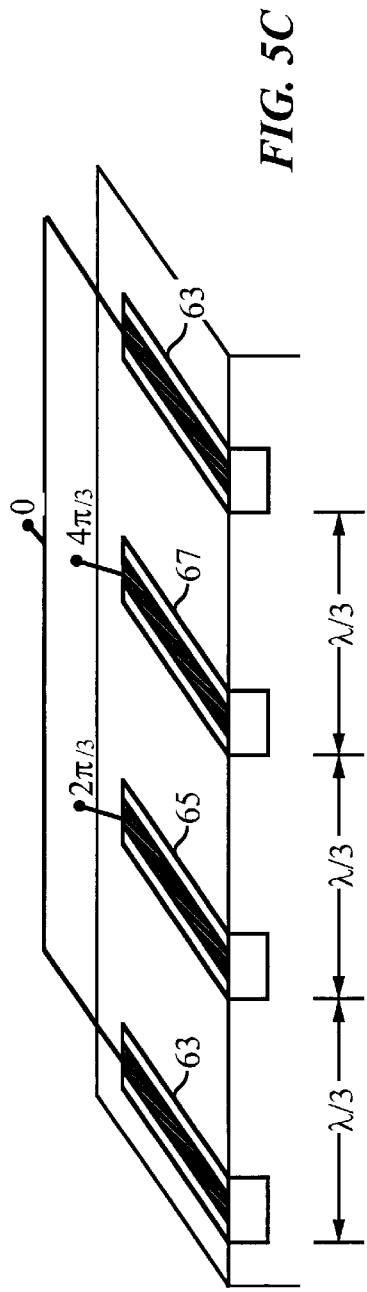

MICROMACHINED RAYLEIGH, LAMB, AND BULK WAVE CAPACITIVE ULTRASONIC TRANSDUCERS

CROSS-REFERENCE TO RELATED APPLICATIONS

This application is based on Provisional application No. 60/102,762 filed Oct. 2, 1998, which is herein incorporated by reference.

STATEMENT REGARDING FEDERALLY SPONSORED RESEARCH OR DEVELOPMENT

This invention was supported in part by contract numbers 94-1-0730 and 96-1-1099 from the Office of Naval Research (ONR). The U.S. Government has certain rights in the invention.

FIELD OF THE INVENTION

This invention relates generally to ultrasonic transducers. More particularly, it relates to micromachined capacitive ultrasonic transducers for generating and detecting Rayleigh, Lamb, and bulk waves in solids.

BACKGROUND ART

Ultrasonic transducers are used to generate and detect acoustic waves in solid and fluid media. They are found in a wide variety of applications, including chemical sensing, signal processing, nondestructive evaluation, and medical imaging. Based on the desired application, they can be tailored to produce and detect particular frequencies in a suitable medium. Chemical sensors, for example, excite ultrasonic waves in a solid substrate. The waves are generated in one region of the substrate, and pass through an area subject to chemical adsorption. The resultant density change in the adsorbing region alters the wave's propagation speed in the material, and this change is then detected at the other end of the sensor.

Conventional ultrasonic transducers are used to excite and detect Rayleigh (surface), Lamb (plate), and bulk waves in solid media. Transducer design and operating conditions are chosen to select a particular mode required by the application. For generation of waves in solids, three types of transducers are commonly found: piezoelectric, electromagnetic, and thermal. Each type has some drawbacks, either in efficiency, bandwidth, or ease of manufacture. Piezoelectric transducers, the most common type, require the deposition of piezoelectric material on a substrate before a voltage can be applied to the material to generate the waves. Creating the circuitry and depositing the piezoelectric material require independent manufacturing processes, making the overall process costly and inefficient. Electromagnetic transducers combine magnetic field application with fringing eddy currents to generate a sufficient force to excite ultrasonic waves. Thermal excitation transducers use lasers operating in the ablation regime to generate the waves. These transducers are clearly more complex and expensive to operate than piezoelectric transducers.

For applications requiring generation and detection of waves in air or other fluids, capacitive ultrasonic transducers are much more efficient than the above types. Examples of capacitive transducers are described in U.S. Pat. No. 5,287,331, issued to Schindel et al.; U.S. Pat. No. 5,619,476, issued to Haller et al.; and U.S. Pat. No. 5,894,452, issued to Ladabaum et al. In general, capacitive transducers contain a substrate and an array of membranes, usually circular, supported above the substrate by a dielectric material. Both the membranes and substrate have a conductive region, and can be thought of as plates of a capacitor. When an electrical signal is applied across the plates, an electric field between the substrate and membrane causes the membrane to vibrate, generating acoustic waves in the air at the frequency of the applied signal. Similarly, when an airborne acoustic wave is received by the membrane, it generates a corresponding electrical signal. If the substrate is silicon, the entire transducer can be produced using well-known silicon processing techniques, allowing for micron-scale accuracy. Capacitive transducers are particularly attractive because they can be produced inexpensively and are easily integrated with the required electronics.

Capacitive transducers are not very efficient in transferring energy from the membrane to the surrounding fluid. In fact, in some cases up to 90% of the energy is instead transferred to the support structure. However, because they are designed for excitation and detection of fluid waves, existing transducers cannot be used to excite acoustic modes of the solid support structure efficiently, and the energy coupled into the solid is wasted.

There is a need, therefore, for a capacitive ultrasonic transducer that can selectively excite and detect Rayleigh, Lamb, or bulk modes in solids.

OBJECTS AND ADVANTAGES

Accordingly, it is a primary object of the present invention to provide a capacitive ultrasonic transducer for exciting and detecting particular Rayleigh, Lamb, and bulk acoustic modes in a solid.

It is a further object of the invention to provide an ultrasonic transducer that can be produced by standard integrated circuit manufacturing techniques. These well-developed methods provide excellent control, precision, scalability, and repeatability.

It is an additional object of the invention to provide an ultrasonic transducer that can be easily integrated with the required electronics, even on the same wafer, without requiring additional materials.

It is another object of the present invention to provide a capacitive ultrasonic transducer than can replace existing piezoelectric transducers in many applications including sensing, filtering, and imaging.

SUMMARY

These objects and advantages are attained by a capacitive ultrasonic transducer for selectively generating and detecting Rayleigh (surface), Lamb (plate), and bulk wave modes in a solid. The transducer includes a support structure, formed from a substrate, preferably a silicon wafer, with a conductive back electrode, and a support material on the substrate; a membrane fixed to and supported by support regions of the support material; and a conductive film in communication with the membrane. A voltage applied between the conductive back electrode and conductive film generates an attractive force between the membrane and substrate, causing the membrane to vibrate with the applied frequency. Membrane vibration couples stresses into the support structure, generating ultrasonic waves in the solid.

Conversely, existing waves in the solid cause membrane vibration and generation of an electrical signal.

The support material contains support regions, which are defined by a height $h_s$ and a thickness $t_s$ and have at least two extended parallel edges. The membrane is fixed above the parallel edges and supported above the substrate to define at least one elongated gap between the membrane, support regions, and substrate. Preferably, there are more than one gaps defined by more than two parallel edges, and more than one membranes are supported above the gaps. The gaps are separated by a predetermined distance d. Preferably, unsupported free regions of the membranes above the gaps are substantially rectangular. They may also be curved, to focus the ultrasonic waves. The membranes have a thickness $t_m$ and are capable of vibrating above the gaps at a predetermined frequency; $h_s$, $t_s$, $t_m$, and d are chosen to couple energy of the vibrating membranes to a particular acoustic mode of the support structure. The acoustic modes propagate in a direction perpendicular to the parallel edges.

To select an acoustic mode of the transducer, a particular value of the distance d between adjacent gaps and unsupported free regions of the membranes is chosen. d may be equal to a wavelength, half-wavelength, or one-third of a wavelength of the chosen acoustic mode. Alternately, the gaps may be divided into subsets, with each subset having gaps that are separated by a negligible distance. The subsets themselves are separated by a distance equal to a wavelength or half-wavelength of the chosen acoustic mode.

The present invention also provides a method for using a capacitive ultrasonic transducer. The method includes two steps: vibrating the membranes above the gaps to generate acoustic waves with particular propagation characteristics in the conductive substrate and support material, and selecting the propagation characteristics of the acoustic waves. Preferably, the support regions have substantially parallel edges, and the waves propagate in a direction perpendicular to the parallel edges. The membranes may be vibrated by applying an electrical signal between the back electrode and the conductive film. The electrical signal has an AC component and a DC component, and excites a Rayleigh, Lamb, or bulk acoustic wave mode. Different regions of the membrane may be excited with different phases, or with different values of the DC component.

BRIEF DESCRIPTION OF THE FIGURES

FIGS. 5A–5E are front perspective views of alternate embodiments of an ultrasonic transducer.

DETAILED DESCRIPTION

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

Figure 1A:
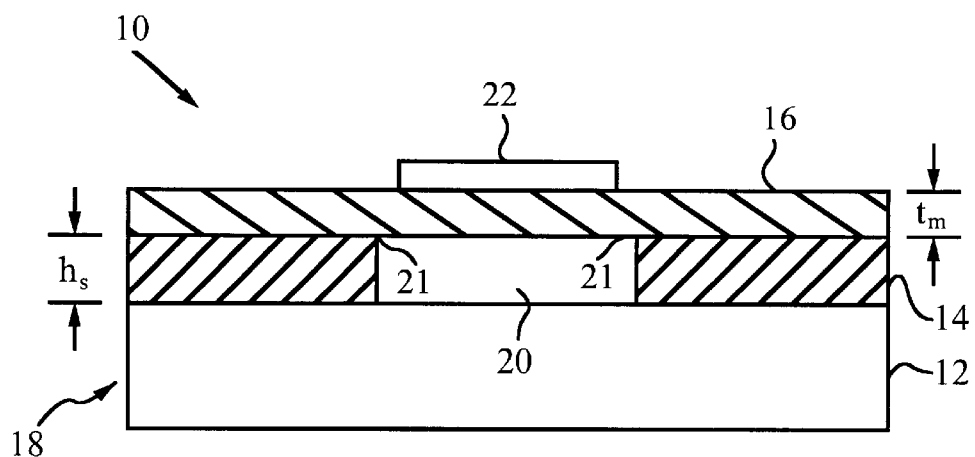
FIG. 1A is a cross-sectional view of an embedded ultrasonic transducer of the present invention.
Figure 1B:
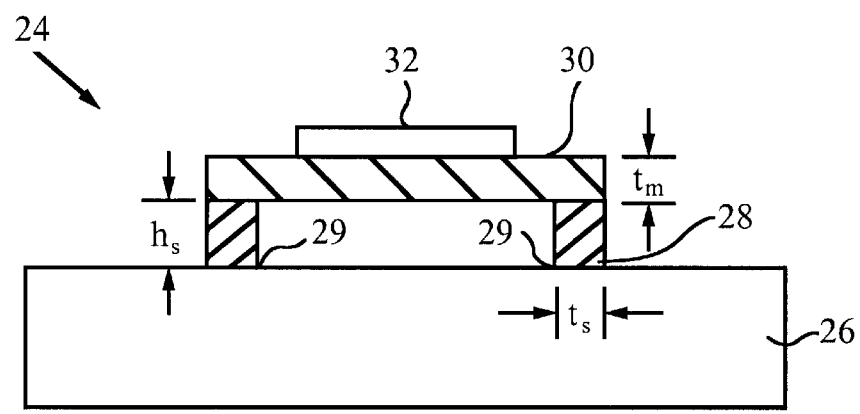
FIG. 1B is a cross-sectional view of a surface ultrasonic transducer of the present invention.

Two embodiments of a single-membrane capacitive ultrasonic transducer are shown in cross section in FIGS. 1A and 1B. FIG. 1A shows an embedded transducer 10, which contains a substrate 12, a support material 14, and a membrane 16. Substrate 12 and support material 14 form a support structure 18. Support material 14 contains support regions with parallel edges 21 (parallel to each other out of the plane of the paper) that support membrane 16 above, and preferably planar parallel to, substrate 12. A gap 20 is defined by the support regions of support material 14, membrane 16, and substrate 12. Above membrane 16 is a conductive film 22. Substrate 12 also has a conductive back electrode, preferably on its top or bottom surface (not shown).

FIG. 1B shows an alternate embodiment, termed a "surface" transducer 24. Surface transducer 24 is almost identical to embedded transducer 10: it contains a substrate 26, a support material 28 with parallel edges 29, a membrane 30, and a conductive film 32. In general, a practical transducer will contain more than one single-membrane transducer 10 or 24. For the embodiment of FIG. 1A, multiple gaps are separated by a continuous layer of support material 14. In the case of FIG. 1B, the gaps are surrounded by only a thin layer of support material 28. Both types of single membrane transducers can be used in the devices described below. As illustrated in FIG. 1B, surface transducer 24 allows for additional control of the thickness $t_s$ of support material 28. As can be seen by comparing FIGS. 1A and 1B, the parallel edges are not entirely analogous: in FIG. 1A, parallel edges 21 contact membrane 16, but in FIG. 1B, parallel edges 29 contact substrate 26.

Any suitable materials may be used to construct transducers 10 and 24. The only criteria are that the two conductive electrodes have some portion of the membrane between them, and that the conductive electrodes are not connected by a conductive material. The materials described below refer to transducer 10 of FIG. 1A, but also apply to transducer 24 of FIG. 1B. Preferably, substrate 12 is a silicon wafer, doped or undoped. Alternately, substrate 12 may be made of glass. Substrate 12 must contain a conductive back electrode. If the substrate itself is doped enough, it may serve as the back electrode. Alternately, the back electrode is a layer, either on the bottom of substrate 12 or between substrate 12 and support material 14. The back electrode may be aluminum, doped silicon, or doped polysilicon. Support material 14 is preferably insulating, and most preferably silicon oxide, with a height $h_s$ preferably between 0.1 and 2.0 μm. However, support material 14 may be conductive, provided that membrane 16 is not conductive. Membrane 16 is preferably silicon nitride with a thickness tm between 0.1 and 1.0 μm, but may also be a polysilicon membrane. Conductive film 22 is preferably aluminum. It may be above membrane 16, as shown, but it may also be inside the membrane. Alternately, conductive film 22 does not contact the membrane.

During transducer operation, membrane 16 or 30 is vibrated at particular frequencies. In transducer 10, vibrating membrane 16 applies longitudinal and shear stresses to support structure 18 at parallel edges 21 at the edges of membrane 16. In transducer 24, the stresses are coupled into substrate 26 at parallel edges 29. These stresses excite acoustic waves in the support structure; in general, the structure can support many propagation modes. In particular, Rayleigh (surface), Lamb (plate), and bulk wave modes can all be excited. Different types of waves and different modes are used for different applications. Desired modes can be chosen by controlling the appropriate transducer dimensions, as discussed further below. Both the surface and embedded transducers produce approximately equivalent excitation efficiencies, and either embodiment can be used in the devices described below.

The principles governing operation of capacitive transducers are well described in the prior art. For example, U.S. Pat. No. 5,619,476, issued to Haller et al., describes the operation of a capacitive transducer for exciting airborne waves. Briefly, the membrane and substrate can be thought of as plates of a parallel plate capacitor. When a voltage is applied across the two, the membrane experiences an attractive electrostatic force that is inversely proportional to the distance between the plates. Of course, the voltage is actually applied to the thin conductive films that serve as the electrodes. Applying a time-varying signal causes the membrane to vibrate at the frequency of the applied signal; preferably, the signal is AC with a DC bias. Without the DC bias, the membrane vibrates at twice the frequency of the applied AC signal. If the distance between the membrane and substrate is made small enough, strong enough ultrasonic waves can be excited in the substrate for practical use. The structure can also be used to detect ultrasonic waves in the solid that cause vibration of the membrane, which generates a measurable time-varying voltage across the plates. If the top conductive film is constructed such that it does not contact the membrane, it can still vibrate the membrane through electrostatic forces.

For most applications, a series of spaced membranes is needed. When the embedded embodiment is used, a series of gaps can be covered with a single, continuous membrane, defining unsupported free regions of the membrane over the gaps. Only the unsupported free regions vibrate and contribute to the acoustic waves in the support structure. Of course, for the surface embodiment, each gap must be covered with an individual membrane. In the discussion below, the free regions of the membrane will be referred to as separate membranes. However, it should be understood that the separate membranes discussed may be either separate membranes or free regions of a continuous membrane.

Figure 2:
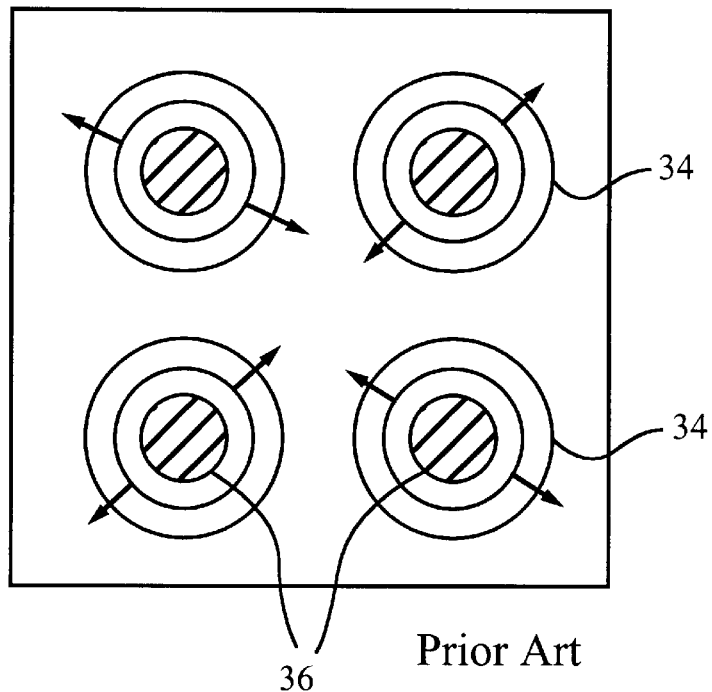
FIG. 2 is a top plan view of a capacitive ultrasonic transducer with circular membranes as known in the prior art.

Prior art capacitive ultrasonic transducers designed for producing and detecting acoustic waves in the surrounding fluid medium also generate waves in the solid support structure. However, these transducers do not excite coherent waves in the solid. For example, transducers often contain an array of circular membranes, as illustrated in FIG. 2. Surface waves 34 generated by membranes 36 will not interfere constructively to excite a surface acoustic wave mode.

Figure 3:
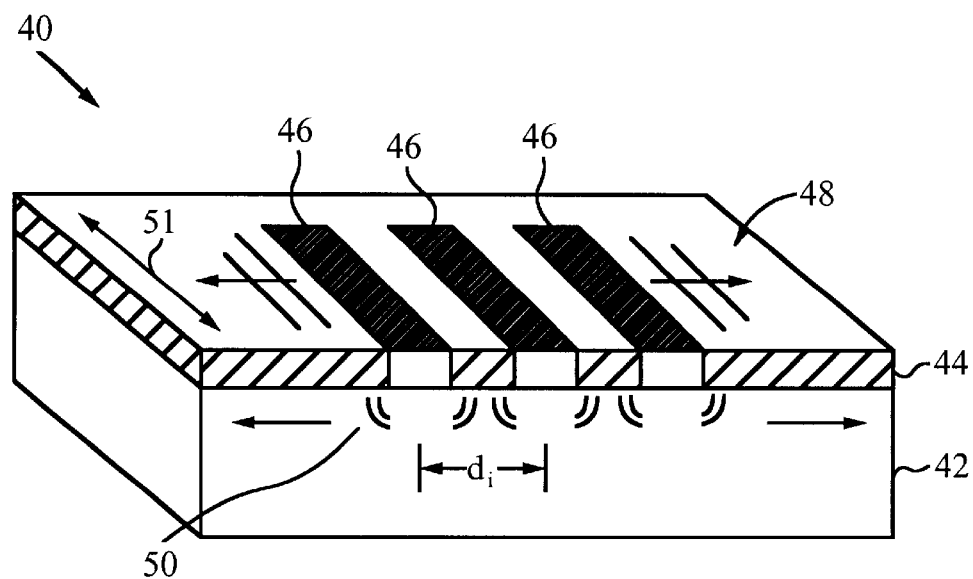
FIG. 3 is a front perspective view of a transducer of the present invention.

To excite coherent surface waves, a particular geometry of membranes and gaps is required: the membrane edges at which the stresses are coupled into the solid must be parallel to each other. A preferred embodiment of a transducer 40 containing interdigital membranes is shown in FIG. 3. Transducer 40 contains a substrate 42, a support material 44, and a series of interdigital membranes 46, separated by a distance d. When membranes 46 vibrate, both surface waves 48 and Lamb waves 50 may be generated in substrate 42 and support material 44. As illustrated in FIG. 3, the gaps are elongated in shape, and are defined by the extended parallel edges of support regions of support material 44. Membranes 46 are excited to generate waves at the parallel edges propagating perpendicular to the edges. In the case of transducer 40, the edges extend in a direction indicated by an arrow 51, and the waves propagate perpendicular to arrow 51. The propagation directions of surface waves 48 and Lamb waves 50 are indicated by arrows. Preferably, as shown in FIG. 3, the gaps and free regions of the membrane are rectangular. They may instead by curved or arc-shaped, in order to focus the waves. Membrane width is preferably between 1 and 200 $\mu$m.

Transducer 40 is analogous to an interdigital piezoelectric transducer, with piezoelectric material replaced by vibrating membranes. Design of the transducer dimensions and understanding of governing theories are therefore well-known to those skilled in the art. Because the membrane is itself a resonant structure, however, a capacitive transducer may use only a single membrane, in which case it is limited to operation at a very narrow bandwidth around the membrane's resonant frequency. Of course, impedance matching and other conditions determine whether sufficient power coupling into the support may be achieved. Multiple-membrane transducers, on the other hand, do not need to operate exactly at the membrane's resonant frequency; even if the membranes are not resonating, they will exert stresses on the support structure.

FIG. 3 illustrates the basic design of the transducer of the present invention. This basic design must then be adapted to the desired application and its required operating condition. Using silicon micromachining techniques, it is possible to fabricate a transducer highly accurately to achieve a wide range of operating frequencies, bandwidths, phase velocities, and wavelengths. The following variables must be set: membrane material, membrane width, membrane thickness $t_m$, membrane separation distance d, support height $h_s$, and support thickness $t_s$. Anyone skilled in the art of acoustics will be able to choose values to achieve the proper transducer operation.

First, the appropriate transducer frequency is chosen by designing the membrane resonant frequency, which depends on the membrane thickness, width, and material. For example, for a 1 $\mu$m thick silicon nitride membrane, widths of 10, 25, 50, and 100 $\mu$m correspond to resonance frequencies of 100, 17, 4.5, and 1.3 MHz, respectively. In general, the transducer should be designed with the membrane resonant frequency near the central frequency of the desired bandwidth.

Figure 4:
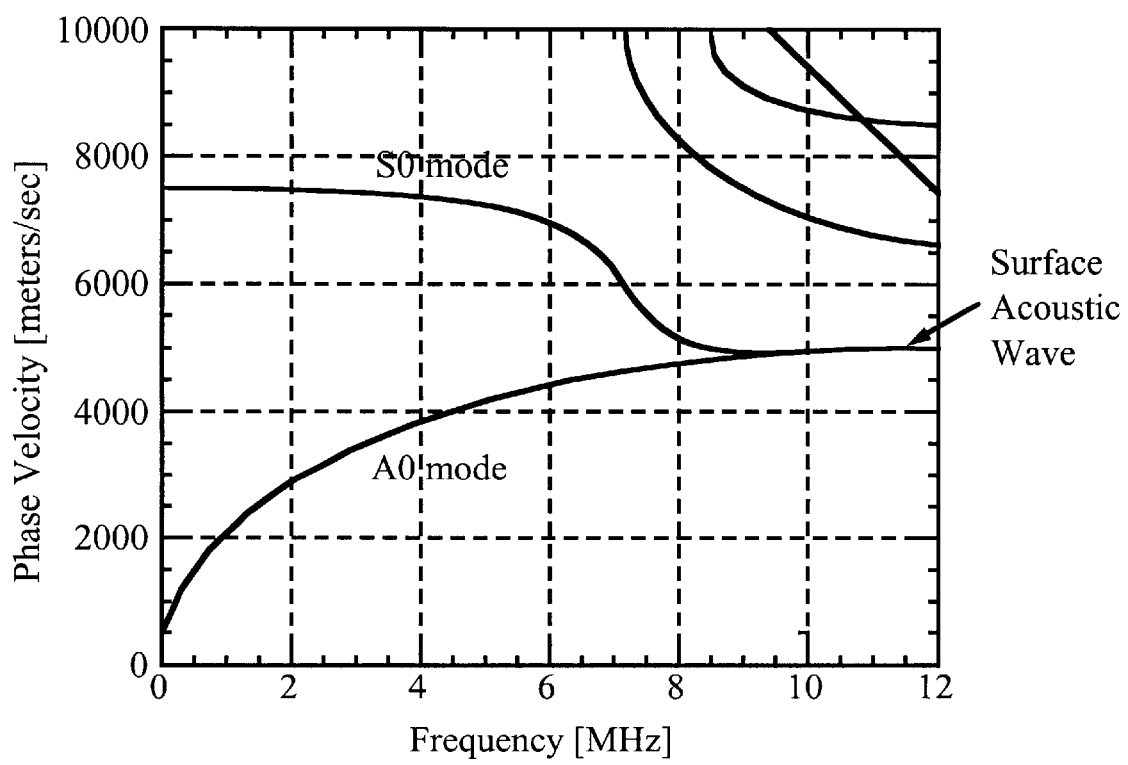
FIG. 4 is a dispersion curve of Lamb waves in a 0.5 mm thick silicon wafer with a <001>cut and <100>propagation direction.

By choosing separation distance of the membranes for a given range of applied frequencies, the coupling can be controlled to select for a particular Lamb (plate) mode or a Rayleigh (surface) mode. FIG. 4 shows a dispersion curve for a 0.5 mm thick silicon wafer with a <001>cut and a propagation direction of <100>. A dispersion curve illustrates phase velocity as a function of frequency for various modes. The S0 and A0 modes are the lowest order symmetric and asymmetric Lamb modes, respectively. At low frequencies, for a given substrate thickness, most of the energy of the vibrating membrane is coupled into the A0 Lamb wave mode, and at higher (intermediate) frequencies, the energy is coupled equally well into the A0 and S0 modes. In general, very little energy is coupled into the higher order Lamb modes. At high frequencies, the A0 and S0 modes converge to the surface acoustic wave. Using the information displayed in FIG. 4, mode selection can be accomplished by proper choice of operation frequency and separation distance of membranes. Membranes can be driven in unison, or with a 180° or other phase shift.

For example, RF filters, commonly made from piezoelectric transducers, can be constructed from the present transducer by selectively exciting surface acoustic waves. When a very broadband signal is applied to a set of transmitter membranes, only a well-defined band of frequencies surrounding the membrane resonant frequency will be efficiently coupled into a surface acoustic wave mode. This mode then excites a different set of receiver membranes to generate a filtered signal. A typical applicable RF signal is 100 MHz. Assuming that the curve in FIG. 4 extends at a nearly constant velocity as frequency increases, the corresponding phase velocity is approximately 5000 m/s, which implies a surface wavelength of approximately 50 $\mu$m. The membranes should then be separated by 50 $\mu$m, so that the surface acoustic waves generated by the membranes resonating at or near 100 MHz constructively interfere with each other. The bandshape over which the filter operates is controlled by the number and overlap of membranes, and the resonant bandshape of each individual membrane.

Figure 5D:
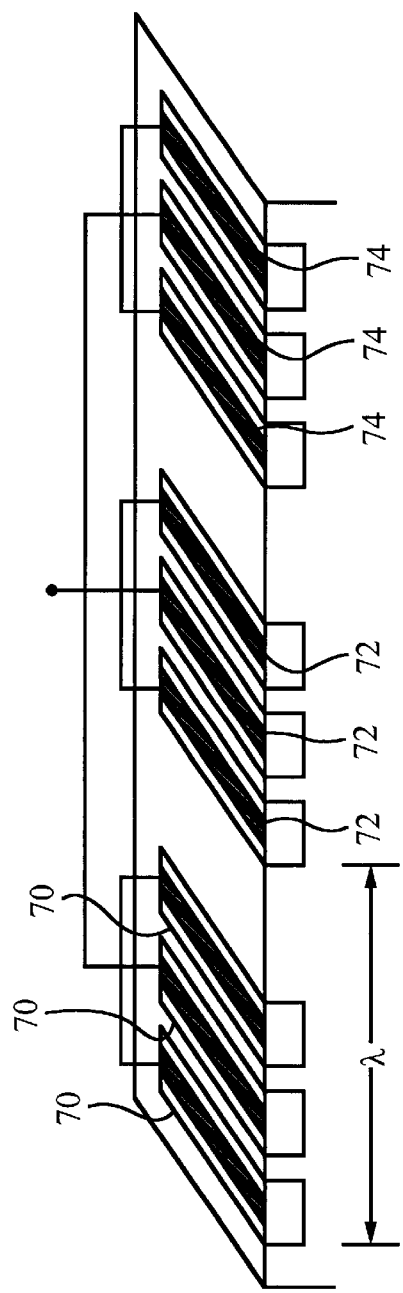

FIGS. 5A–5E illustrate different arrangements of membranes for exciting a surface wave with wavelength $\lambda$. This examples are intended to illustrate, but not limit, the potential arrangements of membranes in the present invention. In FIG. 5A, a substrate 60 contains membranes 62. Three membranes are shown, but any suitable number may be used. All membranes are separated by a distance $d=\lambda$. All three membranes 62 are driven in unison, i.e., with the same frequency, phase, amplitude, and DC bias. FIG. 5B shows an alternate arrangement, in which $d=\lambda/2$ and consecutive membranes are driven with a 180° phase shift. In a substrate 64, membranes 66 are driven in unison, and membranes 68 are driven in unison with each other but completely out of phase with membranes 66. This configuration allows for more power coupling into the support structure for a given surface area. Alternately, as shown in FIG. 5C, membranes 63, 65, and 67 may be separated by $\lambda/3$ and driven with the appropriate phase shift: membranes 63 have no phase shift, while membrane 65 has a $2\pi/3$ (120°) shift from membranes 63, and membrane 67 has a $4\pi/3$ (240°) shift.

Figure 5E:
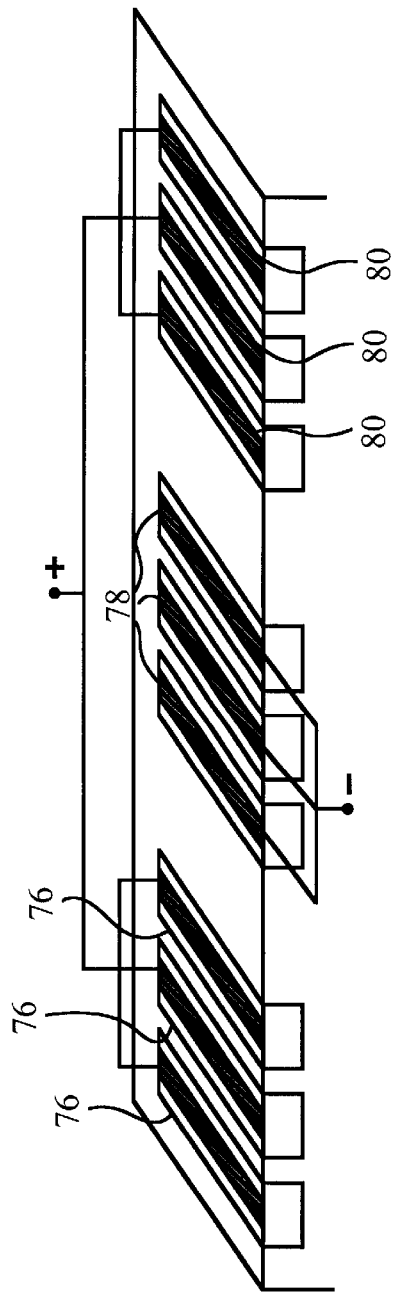

Even greater power coupling can be obtained with the configurations of FIGS. 5D and 5E. In these embodiments, membranes are grouped into subsets. In FIG. 5D, membranes 70, 72, and 74 are divided into groups of three membranes. Each individual membrane has the same fundamental resonance frequency as in FIGS. 5A–C, and therefore the same wavelength surface acoustic waves are excited. The membrane width is much smaller than the surface wavelength (FIGS. 5 are not to scale), and grouping the membranes increases the stress exerted on the solid, without changing any other characteristics of the configuration. The grouped membrane structure allows for much greater acoustic wave amplitude and therefore a higher sensitivity in filtering. Separation distances between membranes within a subset are negligible, while the subsets containing membranes 70, 72, and 74 are separated by $\lambda$. The number of membranes within a group is limited only by their width: the maximum width of the membrane group is $\lambda/4$. FIG. 5E shows an alternate embodiment, in which membrane groups are separated by $\lambda/2$. Membranes 76 and 80 are excited in phase with each other, while membranes 78 are out of phase with those in the first groups but in phase with each other. Of course, any other suitable arrangement of membranes for maximizing sensitivity and efficiency are within the scope of the present invention.

Membranes 62 of FIG. 5A may be excited with the same frequency, but with a different DC bias. Selective alteration of the DC bias of individual membranes can be used to change the resonant frequency of the membranes. In certain applications, it is desirable for different membranes to be operating at different resonant modes.

If the DC bias is increased enough, the membrane will be attracted to the substrate so strongly that it will contact the substrate and remain fixed to it until the voltage is decreased. In this way, individual membranes may be "turned off" as desired to create a code-a series of "on" and "off" membranes. The selected code can then be transferred to a transmitted or received signal. The present invention provides a distinct advantage over existing transducers, which have preset codes, for performing this function: simply by changing the DC bias, any desired series of 1's and 0's can be created with a single transducer.

Figure 6:
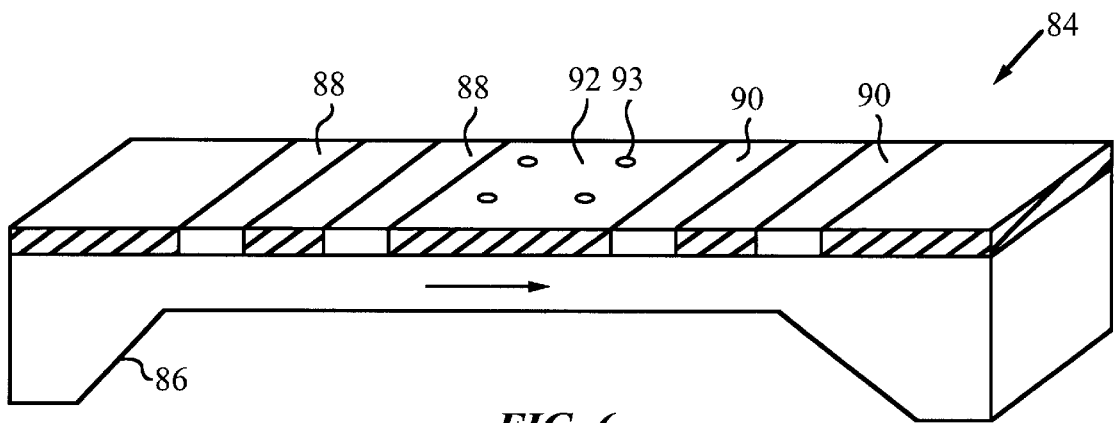
FIG. 6 is a front perspective view of an ultrasonic chemical sensor.

As shown in FIG. 4, Lamb waves are excited at much lower frequencies for a given substrate thickness; however, they can be excited at higher frequencies by decreasing the substrate thickness. Selection between A0 and S0 modes is also achieved by selection of separation distance between membranes. FIG. 6 illustrates a chemical sensor 84 designed to couple the A0 Lamb mode into the solid. Basic sensor operation is as follows: transmitter membranes 88 are excited to generate Lamb waves, which travel through substrate 86 toward receiver membranes 90, where the ultrasonic waves are transformed into an electrical signal. Region 92 has been treated to make it highly adsorbent to a particular chemical species 93. Adsorption of the species changes the apparent density of substrate 86, and therefore the velocity of the Lamb waves passing through region 92. The change in velocity is detected by receiver membranes 90. Thinning of substrate 86 is necessary to improve the sensitivity of sensor 84, and to couple the membrane vibration into the Lamb mode, rather than a bulk mode. By confining the waves to a narrow region, the effect of the adsorbing species on the wave velocity is enhanced. Preferably, substrate 86 is less than 500 $\mu$m thick.

FIG. 4 can be used to determine a suitable membrane separation to favor excitation of the A0 Lamb wave mode. For an operation frequency of 2 MHz, the phase velocity is approximately 3350 m/s. The resulting wavelength is 1.675 mm, and the membranes should therefore be separated by 1.675 mm to favor this mode. Higher frequencies Lamb waves are possible, and the separation distance of the individual membranes must be altered as necessary. In an alternate embodiment, a transducer similar to sensor 84 of FIG. 6 can be used to excite A0 mode Lamb waves on a thin membrane, which can be coupled to air to produce an efficient ultrasonic air transducer.

Figure 7:
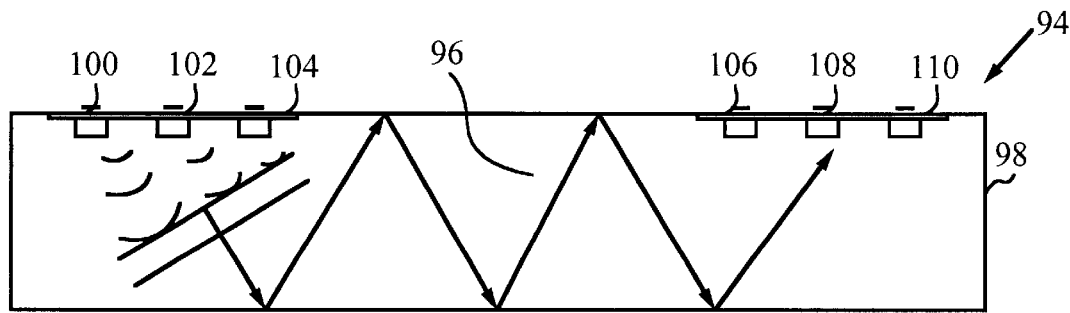
FIG. 7 is a front plan view of an ultrasonic transducer for generating and detecting bulk acoustic waves.

FIG. 7 illustrates an ultrasonic transducer 94 used to excite bulk waves 96 in substrate 98. Shear or longitudinal waves are excited both directly at the membrane edges, and by reflection at the substrate-air interface. The width of membranes 100, 102, and 104 is very small compared with the bulk mode wavelength, and so individual phase fronts from each membrane can combine to form an overall planar or curved phase front. Each membrane is excited individually, and arbitrary phase front angles can be developed by controlled phasing of the excitation of individual membranes, as demonstrated in FIG. 7. Receiver membranes 106, 108, and 110 are used to collect the bulk wave and generate phased signals in a similar manner. Particular bulk wave modes can be selected by choosing appropriate dimensions of the membranes and support regions, as was described above for Lamb and surface modes. It is well known in the art how to select dimensions to produce the desired mode.

One of the distinct advantages of the present invention over, for example, piezoelectric transducers, is that production of the transducer is fully compatible with integrated circuit manufacturing processes. The resultant transducer is inexpensive and can be integrated easily with electronic devices. Furthermore, fabrication follows well-known silicon micromachining processes and can be scaled for mass production and fabrication of transducer arrays. Silicon micromachining techniques also allow for sub-micron precision devices, with anisotropically etched gaps.

Fabrication of micromachined ultrasonic capacitive transducers has been described previously in U.S. Pat. Nos. 5,619,476, 5,894,452, and 5,870,351, and the present invention follows the same general procedures. The particular techniques used for the present invention are described in X.C. Jin et al., "Fabrication and Characterization of Surface Micromachined Capacitive Ultrasonic Immersion Transducers," *IEEE Journal of Microelectromechanical Systems*, Vol. 8(1), pp. 100–114, Mar. 1999, and in the references therein. In order to create gaps under the membrane, support material must be etched away. The methods described by Jin et al. provide for controlled etching of the support material without requiring that the membrane itself be etched. Of course, any method for producing transducers of the present invention may be used.

It will be clear to one skilled in the art that the above embodiments may be altered in many ways without departing from the scope of the invention. For example, on a single transducer, membranes are not necessarily of equal widths. In some applications, it is desirable to have a transducer with a broader frequency response than can be achieved with a single membrane width, or with more than one central frequency, and a range of membrane widths accomplishes this. Multiple membrane separation distances may also be used, as determined by the desired frequencies. Accordingly, the scope of the invention should be determined by the following claims and their legal equivalents.

What is claimed is:

1. A capacitive ultrasonic transducer comprising:
   a) a support structure comprising:
      i) a substrate having a conductive back electrode; and
      ii) a support material on said substrate, said support material having support regions having a height $h_s$, a thickness $t_s$, and at least two extended parallel edges;
   b) a membrane fixed to said support regions above said parallel edges and supported above said substrate to define an elongated gap between said membrane, said substrate, and said support regions, said membrane having a thickness $t_m$ and capable of vibrating above said elongated gap at a predetermined frequency, wherein $h_s$, $t_s$, and $t_m$ are chosen to couple energy of said membrane vibrating at said predetermined frequency to a particular acoustic mode of said support structure; and
   c) a conductive film in communication with said membrane above said elongated gap.

2. The capacitive ultrasonic transducer of claim 1 wherein said particular acoustic mode propagates in a direction perpendicular to said parallel edges.

3. The capacitive ultrasonic transducer of claim 1 wherein an unsupported free region of said membrane above said gap is substantially rectangular.

4. The capacitive ultrasonic transducer of claim 1 wherein an unsupported free region of said membrane above said gap is curved, whereby said particular acoustic mode is focussed.

5. The capacitive ultrasonic transducer of claim 1 wherein said particular acoustic mode is chosen from the group consisting of Rayleigh, Lamb, and bulk waves.

6. The capacitive ultrasonic transducer of claim 1 wherein said support regions have a plurality of parallel edges and said capacitive ultrasonic transducer has a plurality of membranes defining a plurality of elongated gaps, wherein each of said elongated gaps is a predetermined distance d from an adjacent elongated gap, and wherein d is chosen to couple energy of said membranes vibrating at said predetermined frequency to said particular acoustic mode of said support structure.

7. The capacitive ultrasonic transducer of claim 6 wherein d is equal to a wavelength of said particular acoustic mode.

8. The capacitive ultrasonic transducer of claim 6 wherein said plurality of elongated gaps is divided into subsets, wherein each of said subsets contains elongated gaps having a negligible separation distance, and wherein each of said subsets is separated from an adjacent subset by a distance equal to a wavelength of said particular accoustic mode.

9. The capacitive ultrasonic transducer of claim 6 wherein d is equal to a half-wavelength of said particular acoustic mode.

10. The capacitive ultrasonic transducer of claim 6 wherein said plurality of elongated gaps is divided into subsets, wherein each of said subsets contains elongated gaps having a negligible separation distance, and wherein each of said subsets is separated from an adjacent subset by a distance equal to a half-wavelength of said particular accoustic mode.

11. The capacitive ultrasonic transducer of claim 6 wherein d is equal to one-third of a wavelength of said particular acoustic mode.

12. The capacitive ultrasonic transducer of claim 1 wherein said substrate comprises a silicon wafer.

13. A method of using a capacitive ultrasonic transducer, said transducer comprising a substrate having a conductive back electrode, support material on said substrate with support regions defining gaps between said support regions, a plurality of membranes supported above said gaps by said support regions, and a conductive film in communication with said membranes above said gaps, said method comprising the steps of:
   a) vibrating said membranes above said gaps to generate acoustic waves in said substrate and said support material, said acoustic waves having particular propagation characteristics; and
   b) selecting said particular propagation characteristics of said acoustic waves.

14. The method of claim 13 wherein said support regions have substantially parallel edges, and wherein said acoustic waves propagate perpendicular to said parallel edges.

15. The method of claim 13 wherein step (a) comprises applying an electrical signal between said conductive back electrode and said conductive film, said electrical signal comprising an AC component and a DC component.

16. The method of claim 15 wherein a value of said DC component is different for different regions of said membranes.

17. The method of claim 13 wherein different regions of said membranes are vibrated with different phases.

18. The method of claim 13 wherein said acoustic waves are chosen from the group consisting of Rayleigh, Lamb, and bulk waves.

* * * * *